United States Patent [19]

Havens et al.

[11] Patent Number: 5,319,182
[45] Date of Patent: Jun. 7, 1994

[54] INTEGRATED SOLID STATE LIGHT EMITTING AND DETECTING ARRAY AND APPARATUS EMPLOYING SAID ARRAY

[75] Inventors: William H. Havens; Charles M. Hammond, Jr., both of Skaneateles, N.Y.

[73] Assignee: Welch Allyn, Inc., Skaneateles Falls, N.Y.

[21] Appl. No.: 846,471

[22] Filed: Mar. 4, 1992

[51] Int. Cl.$^5$ .............................................. G06K 7/10
[52] U.S. Cl. ................... 235/462; 235/472; 235/454; 235/440; 250/208.2
[58] Field of Search ............... 235/472, 454, 460, 462, 235/440; 250/208.2, 208.1, 552, 553, 568, 566

[56] References Cited

U.S. PATENT DOCUMENTS

| | | | |
|---|---|---|---|
| 3,735,350 | 5/1973 | Lemelson | 235/472 |
| 3,809,893 | 5/1974 | Dobras | 250/227 |
| 3,869,599 | 3/1975 | Sansone | 235/472 |
| 3,918,029 | 11/1975 | Lemelson | 235/472 |
| 3,985,999 | 10/1976 | Yoneyama | 235/463 |
| 4,182,956 | 1/1980 | Funk, Jr. et al. | 250/227 |

(List continued on next page.)

FOREIGN PATENT DOCUMENTS

| | | |
|---|---|---|
| 0174073 | 3/1986 | European Pat. Off. . |
| 0339649 | 11/1989 | European Pat. Off. ............ 250/568 |
| 2509910 | 1/1983 | France . |
| 0145792 | 6/1989 | Japan .................................. 235/454 |
| 2094060 | 9/1982 | United Kingdom . |
| 2235319 | 2/1991 | United Kingdom . |

OTHER PUBLICATIONS

IEEE Spectrum, (May 1982) p. 39 "Integrated Optoelectronics" by Nadav Bar-Chaim, Israel Ury and Amnon Yariv.
IEEE Spectrum, (May 1982) p. 44, "New Devices Studied at Honeywell and Bell", by Gadi, Kaplan.
Nasa Tech Briefs, (May 1990) "Integrated Electro-Optical-Laser-Beam Scanners", p. 26.
Photonics Spectra (May 1990), article entitled "Multiple Quantum Well Spatial Light Modulators", by A. C. Adams.
GE/RCA Optoelectronic Device Data Book (1987), GE Solid State, Sommerville, N.J., p. 19.
Nasa Technical Briefs, (May 1990) p. 28. "Optoelectronic Integrated Circits for Neural Networks".
Electronic Design (Aug. 24, 1989) "Tiny Lasers Printed on Silicon May Simplify Optical Communication" by David Maliniak p. 19.
Laser Focus World (May 1990) "Surface-Emitting Lasers Reach R&D Threshold" by Jack Jewell p. 151.

*Primary Examiner*—Donald Hajec
*Assistant Examiner*—Esther Chin
*Attorney, Agent, or Firm*—Harris Beach & Wilcox

[57] ABSTRACT

There is provided an integrated semiconductor source-detector matrix in which solid state photonic diodes are configured as LEDs, disposed on a substrate and coupled to electronic circuits so that the diodes can be individually driven to emit light or to detect light as may be desired. Providing an integrated matrix of light source (emitter) and light sensor units disposed in close proximity results in each unit having nearly coextensive fields of view and illumination. Apparatus, such as bar code and optical readers utilizing such a matrix are shown, and are insensitive to the diffusion and laminate effects. In alternate embodiments the matrix is coupled to remote sensors or another similar matrix to provide optical communication and interchange devices having high bandwidth.

29 Claims, 7 Drawing Sheets

U.S. PATENT DOCUMENTS

| | | | |
|---|---|---|---|
| 4,264,127 | 4/1981 | Schumacher et al. | 385/85 |
| 4,270,135 | 5/1981 | Schlegel et al. | 307/311 |
| 4,286,145 | 8/1981 | Palmer | 235/454 |
| 4,334,300 | 6/1982 | Arquie et al. | 369/44.12 |
| 4,346,292 | 8/1982 | Routt, Jr. et al. | 250/216 |
| 4,367,483 | 1/1983 | Takahashi et al. | 257/80 |
| 4,488,679 | 12/1984 | Bockholt et al. | 235/472 |
| 4,591,706 | 5/1986 | Sims | 235/454 |
| 4,689,652 | 8/1987 | Shimada et al. | 257/443 |
| 4,695,859 | 9/1987 | Guha et al. | 257/64 |
| 4,730,198 | 3/1988 | Brown et al. | 385/89 |
| 4,733,067 | 3/1988 | Oinoue et al. | 250/216 |
| 4,733,094 | 3/1988 | Carpentier et al. | 250/551 |
| 4,743,773 | 5/1988 | Katana et al. | 250/566 |
| 4,748,319 | 5/1988 | Sasaki et al. | 235/472 |
| 4,757,197 | 7/1988 | Lee | 250/239 |
| 4,764,931 | 8/1988 | Matsuda | 372/29 |
| 4,772,123 | 9/1988 | Radner | 356/153 |
| 4,772,784 | 9/1988 | Yoshitoshi et al. | 250/216 |
| 4,831,275 | 5/1989 | Drucker | 235/472 |
| 4,847,665 | 7/1989 | Mand | 257/195 |
| 4,864,168 | 9/1989 | Kasahara et al. | 307/631 |
| 4,866,258 | 9/1989 | Ueda et al. | 235/472 |
| 4,866,499 | 9/1989 | Aktik | 358/212 |
| 4,867,371 | 9/1989 | Davis et al. | 228/160 |
| 4,873,429 | 10/1989 | Kume et al. | 250/216 |
| 4,877,756 | 10/1989 | Yamamoto et al. | 437/209 |
| 4,879,250 | 11/1989 | Chan | 437/3 |
| 4,910,412 | 3/1990 | Ondris | 250/208.1 |

INTEGRATED SOLID STATE LIGHT EMITTING AND DETECTING ARRAY AND APPARATUS EMPLOYING SAID ARRAY

BACKGROUND OF THE INVENTION

This invention relates to a matrix of integrated semiconductor elements that are operable in either a photoresponsive or photoemissive mode. The present invention is particularly adapted to improving the performance of optical interfaces, optical transmitters, and image detecting apparatus such as bar code scanners or readers, optical heads, and other optical scanners that can be portable and are required to operate with low power consumption.

In conventional mark-sense and imaging apparatus, the light source and light sensor are discrete and have optical paths which generally are not congruent in space. Such an arrangement provides a field of illumination that includes optical patterns of interest, the indicia, but which in general is larger than the light detector's field of view (termed herein the detector's region of sensitivity). The light sensor generates a signal that is specifically responsive to light from the region of sensitivity that is incident on the light sensor.

When the field of illumination is larger than the region of sensitivity, flood illumination is said to be present. In this circumstance the process of accurately interpreting the information content of the indicia being scanned is interfered with, as will now be explained.

In FIG. 11 there is illustrated a typical prior art device wherein LEDs 121, 121 illuminate a field of illumination 124 on target 123. A region of sensitivity 122, being smaller than field of illumination 124, is entirely included within field of illumination 124. The region of sensitivity 122 is viewed by light sensor 127 through optics 125, with field stop aperture 143 and presents a signal to amplifier 129 in response to detected light.

Mark-sense detectors are typically employed in optical scanning devices, such as bar code scanners or readers, in which the output of the detector may be coupled to decoding circuitry. There are a number of known optical effects that can produce errors in the determination of transitions between bars and spaces in a bar code symbol that is situated on a substrate, including the diffusion and laminate effects.

The diffusion effect can be understood with reference to FIGS. 12a and 12b. It results from light, shown representatively as beams 126, that is incident outside the region of sensitivity 122 of a light sensor. Beams 126 enter the substrate 138 on which a pattern is located, and are then scattered internally within the substrate into the region of sensitivity. A fraction of the scattered light is thus ultimately returned to the light sensor via region of sensitivity 122 where it contributes to the received signal level. In scanning applications such as bar code scanning there is another consequence of the diffusion effect. In this application the region of sensitivity travels across dark bars that are separated by fields of light spaces. These spaces are referred to herein as white spaces; however those skilled in the art will understand that areas of high reflectivity are denoted. As the region of sensitivity 122 approaches a dark bar 139, as shown in FIG. 12b, the bar 139 will absorb more light than does a white space of similar dimension. Since some light 128 is absorbed, less is available to scatter into the approaching region of sensitivity. Thus the diffusion effect differs quantitatively when a bar is near the region of sensitivity than when it is not. This can be appreciated with reference to FIG. 13 which shows an analog waveform 130 generated by a bar code scanner utilizing flood illumination which has scanned bar code symbol 132. It will be apparent that the signal minima 137 corresponding to the wide dark bars are quite sharp, while the maxima 135 corresponding to the intervening white spaces are rounded. Furthermore the peaks 136 corresponding to the narrow white spaces between the narrow dark bars 134 are reduced in amplitude relative to maxima 135 corresponding to wide white spaces between the wide dark bars 137. This appearance is predicted by the above discussion of the diffusion effect. If the narrow dark bars could not be resolved due to the modulation transfer function of the reader optical system, the patterns would have been symmetrical about the maxima and minima. While the diffusion effect has been explained in connection with a bar code scanner, it also influences other non-scanning readers of optical patterns as well. In summary, the diffusion effect tends to reduce the apparent white level in the vicinity of dark bars while not affecting the black level.

Another undesired effect of flood illumination in certain imaging applications, such as bar code scanning, is the laminate effect, also known as the overlay effect. Practical bar code symbols often possess protective overlaminates. The laminate effect is caused by the light that is scattered from outside the region of sensitivity being totally internally reflected at the overlaminate-to-air interface onto the region of sensitivity. Reference may be made to FIG. 14 where the laminate effect is depicted diagrammatically. During the lamination process an adhesive flows over the bar code symbol substrate 142, expelling the air between laminate 141 and bar code symbol substrate 142. As a result, the laminate 141 and bar code symbol substrate 142 are in intimate contact and are essentially index matched. When the laminated bar code substrate is illuminated, as with the diffusion effect, some of the incident light rays, such as rays 226a, 226b falling outside the region of sensitivity 122 are scattered from the top surface of layer 142 into overlaminate 141 and are incident on surface 227 at an angle 144 that can exceed the critical angle for total internal reflection. Such light rays 226a, 226b are totally internally reflected into the region of sensitivity 122. A portion of this light is then scattered back toward the overlaminate 141, penetrates it, and finally arrives at the light sensor, where it contributes to the received signal level. As in the case of the diffusion effect, as the region of sensitivity passes over the bar code symbol, some of the incident light will be absorbed by dark bars adjacent to the region of sensitivity, thereby reducing the white space signal level. The magnitude of the laminate effect is a function of laminate thickness, the dimensions of the bar code symbol, reflectance of the bars and spaces, nominal diffusion length in the substrate, and refractive index. While laminate effects are sometimes difficult to quantify, the range of this effect can be quite large. The laminate and diffusion effects are known to degrade the performance of bar code scanners, other types of mark-sense detectors, and image detecting apparatus generally. A laminated bar code symbol typically exhibits both the diffusion and the laminate effects.

It will be recognized that an analogous argument can be made for the case where a small source of illumination is used in conjunction with a large region of sensitivity, so called flood sensitivity. A number of methods have been employed in the prior art that tend to bring the beams of light from the light source and those directed to the light sensor from the target into alignment, establishing a common operational region. The images of the light source and the defined region of sensitivity are generally not congruent throughout a relatively large depth of field. For this reason, all these systems are sensitive to the degrading effects of the diffusion and laminate effects over all or most of their operational depth of field.

For example, in U.S. Pat. No. 4,346,292 to Routt, Jr. et al, there is shown an optical scanner in which source and reflected light beams are coaxially aligned at the target. In this device the region of sensitivity is substantially congruent with the field of illumination only in the immediate neighborhood of the focal plane, and it cannot achieve a larger depth of field without flood illuminating the target.

U.S. Pat. No. 4,675,531 to Clark et al shows a scanner that has coaxial incident and reflective beams, achieved by a multisurfaced lens arrangement. The beams, while having the same optical axis, could not define a light source image that is congruent to a region of sensitivity except in the focal plane. This device would not be suitable for applications requiring a larger depth of focus where flood illumination is undesirable.

In U.S. Pat. No. 4,816,659 to Bianco et al an apparatus is shown in which a bar code symbol is illuminated by a lamp, and a reflected beam received by a photosensor. The illumination and detection optical axes are not coaxially aligned in the plane of the bar code symbol.

Another problem known to the art concerns the operation of imaging devices when there is ambient light that enters the light sensor and creates additional noise background. This problem has been mitigated by the adoption of lasers and LEDs as light sources or light emitters that cooperate with light sensors tailored to respond selectively to wavelengths emitted by the lasers or LEDs in conjunction with appropriate bandpass filters. Representative of this approach is the disclosure of U.S. Pat. No. 4,866,258 to Ueda et al wherein an optical pattern detector employs a photodiode disposed side-by-side with an LED.

Still another problem in the art which can be attacked by optoelectronic source-detector integration is the well-known problem of microphonic excitation that can cause spurious output of the light sensor. The severity of this problem is lessened when the photodetection system has an inherently high signal-to-noise ratio as does an integrated source-detector.

There has been recent interest in developing image detection and scanning devices having light sources integrated with light sensors such as photodiodes. Manufacture of large area integrated semiconductor arrays is now relatively economical. Techniques of fabricating small light sensing elements and light emitting elements on large area substrates are known. The integration of densely packed minute surface emitting lasers on a substrate using lithographic techniques was reported in by D. Maliniak, *"Electronic Design"*, Aug. 24, 1989, page 19. Such lasers are not only physically small, but also operate with low power dissipation.

In U.S. Pat. No. 4,695,859 to Guha et al there is disclosed a large scale integrated solid state structure that includes light emitting and light sensing p-i-n diodes, used in document scanning applications. In this disclosure the construction of the light sources and light sensors are similar, but the details are optimized for their respective functions.

The use of integrated optoelectronic source-detector technology in imaging applications has thus far been limited. Successful implementation of such components into scanning and imaging devices would advance the optical reading art, as a result of enhanced resolution, increased reading speed, increased accuracy and reduced power consumption. Such devices have broader application to optical information transmission in that they can be incorporated in optical tracking applications as well as optical interfaces of all types, and could be used in optical computers.

SUMMARY OF THE INVENTION

It is therefore a primary object of the present invention to provide an improved optoelectronic integrated source-detector matrix that can be economically fabricated on a large area substrate from semiconductor alloy materials.

It is another object of the present invention to improve the performance of optical detectors and scanning devices by incorporating therein an improved integrated source-detector matrix.

It is yet another object of the present invention to perform improved optical image detection in a large working depth of field without flood illuminating the subject image.

It is still another object of the present invention to provide optical detectors utilizing therein an improved integrated source-detector matrix that operates accurately with a low level of illumination current.

These and other objects of the present invention are attained in a preferred embodiment by a plurality of identically fabricated solid state photonic diodes that are configured as LEDs, disposed on a substrate and coupled to electronic circuits so that the diodes can be individually driven to emit light or to detect light as may be desired, thereby creating an integrated source-detector matrix. The term "photonic" is used generically herein to include both light emission and light detection functions of which such LEDs are capable. As is explained in *GE/RCA Optoelectronic Devices Data Book* (1987), GE Solid State, Somerville, N.J., Page 19, "all semiconductor junction diodes are photosensitive to some degree over some range of wavelengths of light". "In some cases, light emitting diodes can be used to detect their own wavelengths of light." However it is also known that there are practical limitations in utilizing a light emitting diode as a light receiving element as such. From U.K. Patent Application GB 2 094 060, when this is done, "light receiving sensitivity is remarkably decreased". The LEDs are electrically and optically isolated. Several manufacturers have LED die fabrication processes which could be used to fabricate such devices For example, the process used by Siemens Components, Inc. to fabricate the die for the "RB-42B, MASK-DIFFUSED GaAsP LED", or by Stanley Electric Co., Ltd. to fabricate their "ESBR 3402" LEDs, as well as many others.

Providing a matrix of light source (emitter) and light sensor units disposed in close proximity results in each unit having nearly coextensive fields of view and illumination. Because the light source and light sensor are so closely associated, and can be realized as intermingled elements, it is possible to establish a small, precisely aligned field of view and illumination on a target. An image being so viewed is not flood illuminated. Thus a device incorporating an integrated source-detector is relatively insensitive to the above noted diffusion and laminate effects, and its ability to detect boundaries of indicia is consequently enhanced. By overlapping the fields of view in neighboring units within the array or matrix, it is possible to spatially smooth or effectively defocus a detected image, as may be desirable in certain imaging applications. The advantages of dealing with a smoothed or slightly defocused image are further explained in U.S. Pat. No. 4,591,706 to Sims.

The use of semiconductor devices assures relatively low power consumption. As aforementioned, when semiconductive materials are employed in the construction of source-detector arrays it is possible to design the elements to emit only desired wavelengths of light, and to selectively respond to the emitted wavelengths. This light filtering effect can be exploited to achieve even greater noise rejection so that the instrument can operate successfully under high ambient light conditions. As a consequence of greater signal-to-noise ratio and improved edge detection capability, the device can consequently operate at a more rapid scanning rate.

In one embodiment an economic advantage is realized by constructing the emitting and detecting diodes identically as LEDs. Such LEDs are sufficiently photoemissive and photosensitive to function in optical imaging and transmission applications.

Suitable optics can associate the output of an individual emitter with the field of view of a given detecting element. By configuring the electronic circuitry, groups of diodes can be functionally grouped as desired, so that they function in subunits within the integrated source-detector matrix. For example, as shown in the embodiment of FIG. 7, emitters and detectors can be associated in one-to-one relationship in checker-board fashion, an arrangement that would result in the realization of a large number of optical communication channels on such an integrated source-detector matrix. There are many other geometric grouping possibilities that are not limited to one-to-one associations between light sources (emitters) and sensors (detectors). By incorporating suitable electronic circuitry into the structure, it is possible to configure and optimize an integrated source-detector matrix for a given optical application, and even to dynamically vary the configuration as required. Parameters such as sensitivity, noise, cross-communication due to optical coupling and/or reflections, error detection and correction govern the grouping and ratios of emitters and detectors in optical imaging applications such as bar code scanning.

In another embodiment of the invention the integrated source-detector matrix can be incorporated into a instrument such as a bar code scanner, where it functions as both the light source and the light sensor. By incorporating suitable optics, such as lenses or optical fibers into the scanner, a subunit of one or more light sources can be caused to illuminate a small field on a surface that contains indicia, and the light sensors can be configured so that their region of sensitivity corresponds or is placed in close proximity to the field of illumination. As long as the matrix dimensions on the object plane are comparable or less than the diffusion lengths in the indicia substrate the diffusion and laminate effects discussed above can be largely eliminated. Furthermore, by fabricating the semiconductors so that their emission and absorption spectra are appropriately tailored to the application, unwanted ambient light can be effectively filtered so that the instrument operates with a improved signal-to-noise ratio. The regions of sensitivity of adjacent subunits may overlap if desired, so that a slightly defocused image can be detected by the instrument.

In a variant of the scanning embodiment discussed above, concentric zones of the integrated source-detector matrix are selectively enabled and disabled. This causes the scanning aperture of the instrument to vary, so that the instrument can be optimized to read indicia using various effective spot sizes. As can be seen from inspection of FIG. 10 and from the discussion regarding FIG. 10 below, concentric circles 117, 118, and 119 represent successively larger projections of fields of view on matrix 102. Selective enablement of the light emitting and light detecting photonic elements within the boundary of a selected circle, necessarily results in a variable scanning aperture. This result is inevitable because, as is explained below, the field of view of a light emitting diode is substantially identical with the region of sensitivity of a neighboring light sensitive diode when suitable optics are employed as in FIG. 9.

In still another embodiment, two or more matrices are optically coupled, so that optical information can be transmitted therebetween, and repeated with a high bandwidth and low error rate.

In a still further embodiment, the photonic elements are coupled to fiber optic waveguides, and light can be communicated to and from remote optoelectronic devices or sensors. In this embodiment, shown at FIG. 8, an integrated matrix according to the invention is placed in a machine to be monitored, such as an aircraft, and is coupled to remote sensors that produce optical signals in response to stress, temperature, vibration, and other factors that influence the operation and integrity of the aircraft. By suitably enabling the emitting elements in the integrated source-detector matrix, signals affecting the operation of the sensors may be transmitted to the sensors, and information can be received by the integrated source-detector matrix in the form of light. The matrix itself may be integrated in a suitable computer that monitors the condition of the aircraft. Data received by the matrix may be accessed by the computer by simply addressing the appropriate photonic elements.

The integrated source-detector matrix can be advantageously combined with optics such that the amplitude of the optical signal received by the light sensors is a function of the displacement between the integrated source-detector and the target from which light is reflected. The integrated source-detector matrix can thus be incorporated in tracking devices such as an optical head, such as a CD head. Elements or subunits within the matrix can closely focus on a small target to be tracked, or upon adjacent targets, so that not only can the displacement of the head from the target be rapidly adjusted, but information contained in the target can be multiply read by subunits in the matrix.

BRIEF DESCRIPTION OF THE DRAWINGS

For a better understanding of these and other objects of the present invention, reference is made to the detailed description of the invention which is to be read in conjunction with the following drawings, wherein.

DETAILED DESCRIPTION OF THE INVENTION

Figure 1:
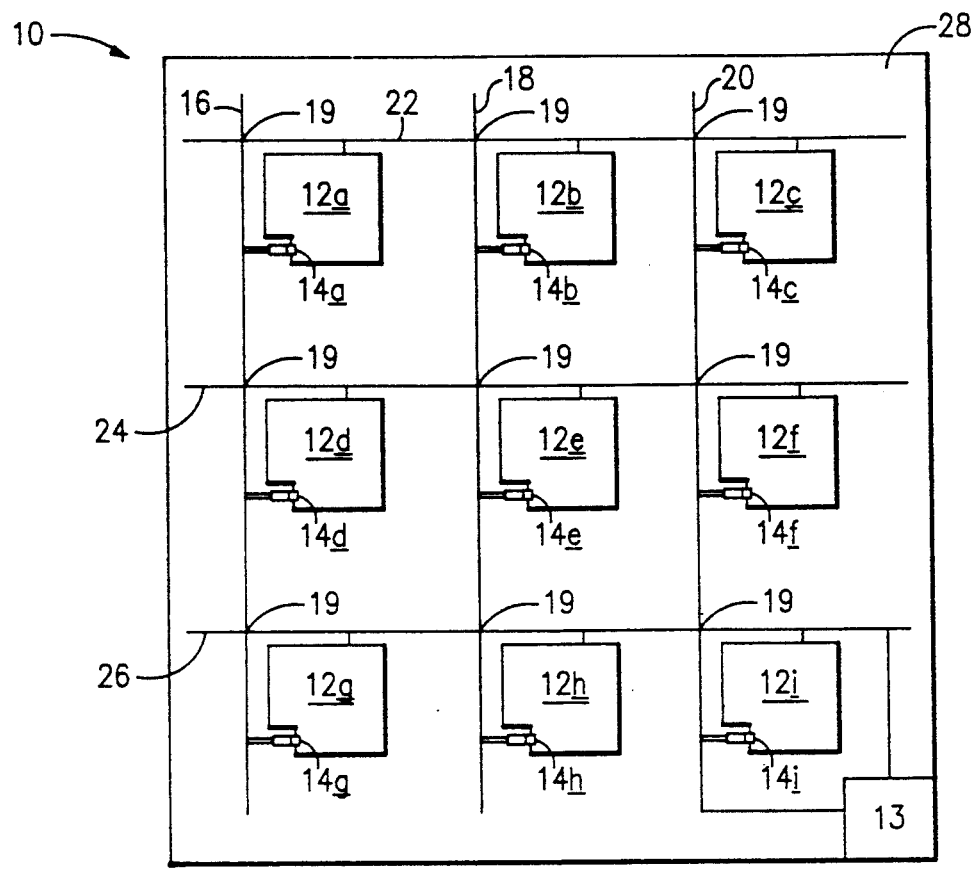
FIG. 1 is a partially schematic top plan view of an integrated source-detector matrix of photonic elements in accordance with the present invention.

Turning now to the drawings, and in particular to FIG. 1, there is shown a preferred embodiment comprising an array or matrix of photonic elements, designated generally by reference numeral 10. FIG. 1 is merely exemplary of a large area matrix, and that an array of dimensions m×n, where m and n are positive integers, may be used without departing from the spirit of the invention. Neither the array nor the elements thereof are necessarily constrained to a rectilinear configuration.

Figure 1A:
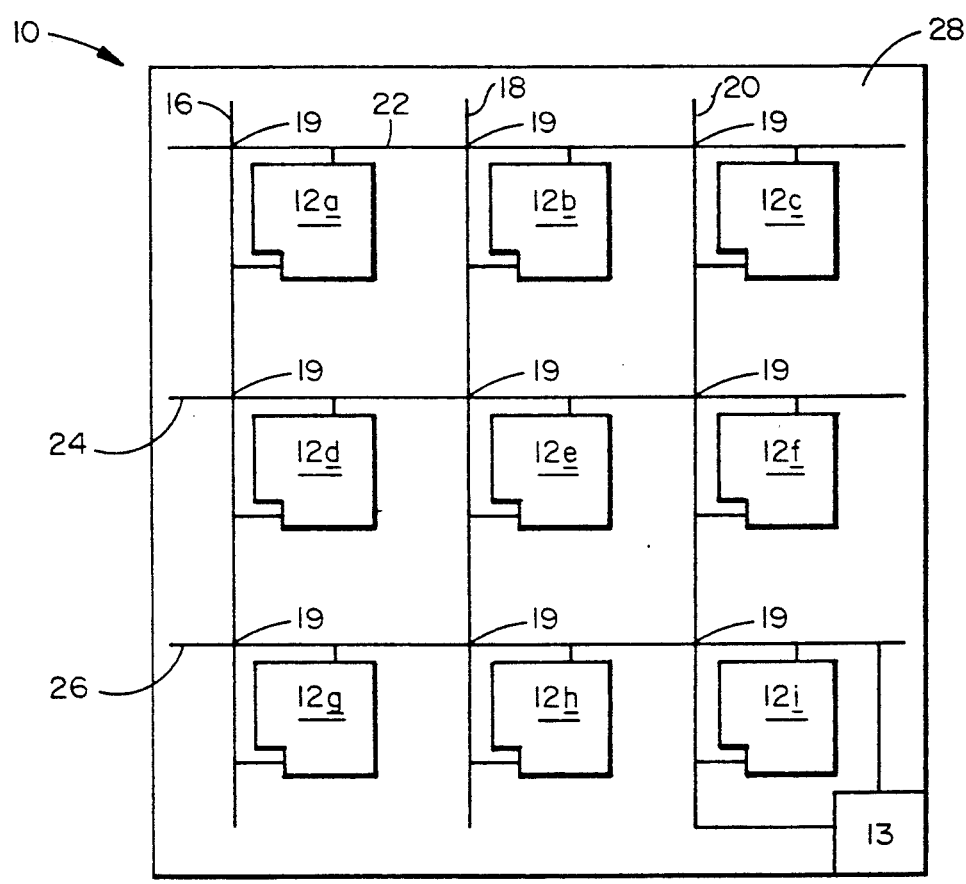
FIG. 1a is a partially schematic view of an integrated source-detector matrix of photonic elements in accordance with an alternate embodiment of the invention.

Array 10 comprises a plurality of photonic elements 12a-12i operatively disposed in a two-dimensional, m x n matrix form. Each photonic element 12a-12i has associated therewith a discrete isolation device 14a-14i which interconnects that element 12 to a bus of address lines 18 connecting each element to one or more data lines 19, 20. These buses or lines are formed of an electrically conductive material such as a metal or a thin film conductive oxide. The interconnection functions can be implemented in various forms depending upon the specific system functions desired. In a preferred embodiment, the isolation devices 14a-14i are omitted and alternate photonic elements are connected directly to the data lines 19 and 20 (See FIG. 1a). In this fashion photonic elements 12a, 12c, 12e, 12g, 12i are connected to data line 19 and photonic elements 12b, 12d, 12f, 12h are connected to data line 20. In this manner large numbers of elements can be controlled in a matrix without the need for addressing logic.

Figure 2:
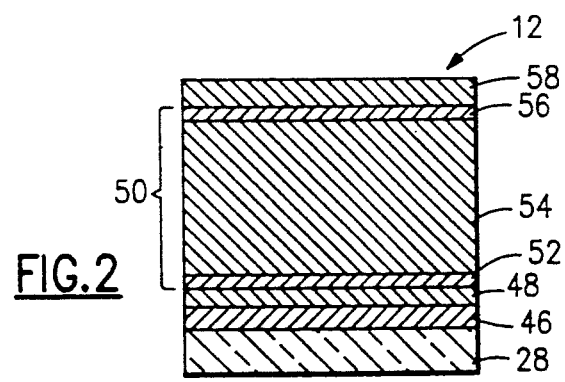
FIG. 2 is a cross sectional side view illustrating a multilayered structure of a photonic element employable in an array in accordance with the invention.

Each of the photonic elements 12a-12i is preferably an LED, as indicated generally by reference numeral 12 in FIG. 2. LED 12 has a well known multilayered structure, and rests on substrate 28. Such an LED can be driven to emit light in response to an electrical signal, and can also produce a detectable electrical signal in response to the absorption of illumination, thus functioning as a photodetector. In the preferred embodiments the diodes 12a-12i are disposed on the same side of substrate 28 so that they are substantially coplanar. Thus the diodes are collocated in a small region, as can be further appreciated with reference to FIG. 3, wherein two neighboring diodes 12, 12 are disposed close together on substrate 28. This arrangement is advantageous in that with appropriate optics, as might be achieved when the image is out of focus, the field of view of a diode 12 that is configured as a light sensor can readily be caused to be substantially coextensive with the field of illumination of a neighboring diode 12 that is configured as a light source. Also if the dimensions of the individual elements as imaged on the indicia substrate are smaller than the substrate diffusion length, typically 0.05 mm. or less, then the system will respond as if the two fields of view are substantially coextensive. It will be evident that flood illumination and the detrimental optical effects resulting therefrom that were discussed above can be avoided.

The isolation devices 14a-14i associated with each of the photonic elements 12a-12i, respectively, are utilized to restrict the flow of electrical current through the photosensitive array 10 to only predetermined paths so as to facilitate the discrete addressing of each particular photosensitive element 12. The isolation devices 14a-14i may comprise a current control device, such as a transistor, a threshold switch, an FET, relay, or the like.

In certain applications it may be desired to integrate ancillary electronic circuitry 13, such as switches, amplifiers, and the like onto substrate 28. Such circuits may be coupled to the address lines in accordance with the requirements of the application. The details of fabrication of integrated solid state circuits and m×n arrays of both one and two dimensions are well known and need not be further described herein.

Figure 3:
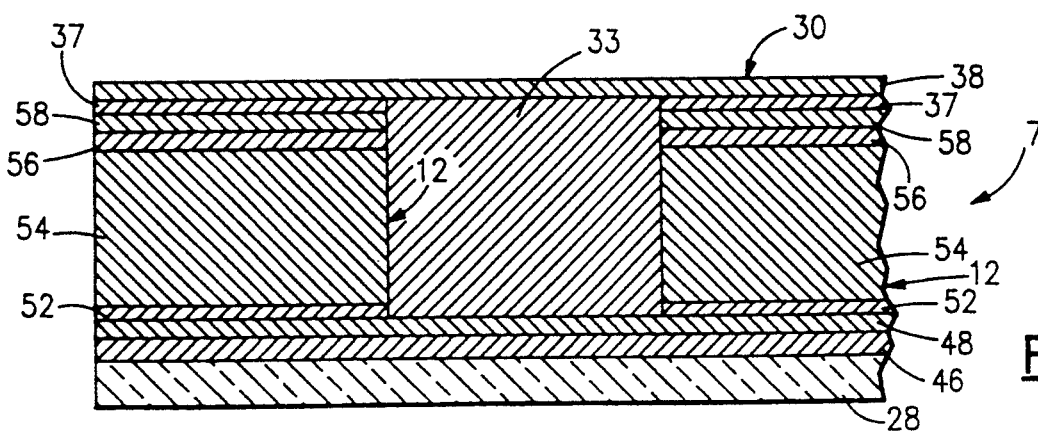
FIG. 3 is a cross sectional side view of two photonic elements operatively disposed in a coplanar arrangement on a common substrate.

It will also be appreciated by those skilled in the art that an optical isolating opaque material may be operatively disposed between the photonic diodes 12a-12i to optically isolate the diodes from one another and substantially reduce optical crosstalk. In FIG. 3 opaque material 33 separates two diodes 12, 12.

As previously mentioned, the invention is preferably practiced with a plurality of identically fabricated LEDs that can be tailored to generate charge when absorbing light radiation, and to emit light when an electrical potential is placed across the layers of semiconductor alloy material so as to forward bias the diode.

Figure 4:
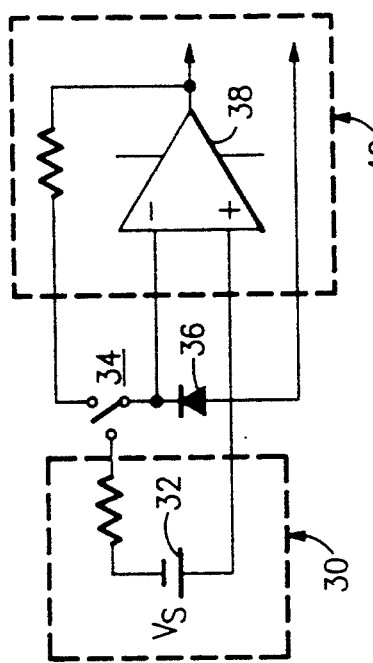
FIG. 4 is an electronic schematic that is helpful in understanding the present invention.

Each of the diodes is coupled to conventional electronic circuitry whereby it can be driven as a light source or can be incorporated in a photodetection circuit whereby an electrical signal is generated in response to light that is detected by the diode. Referring now to FIG. 4, there is shown a photonic element 36 that is switchable by the action of switch 34 between a light source circuit 30 and a light sensor circuit 40. When switch 34 is not engaged, then LED 34 is disabled entirely. Switch 34 can be a mechanical or electronic switch, operable at a required speed, such as a transistor, relay, diode, and the like. Switch 34 may be integrated with array 10 on substrate 28 and incorporated in ancillary electronics 13 if desired, or it may be extrinsic to array 10. Also in some applications it may not be required at all, as the photonic elements may be permanently connected as sources or detectors.

Figure 5:
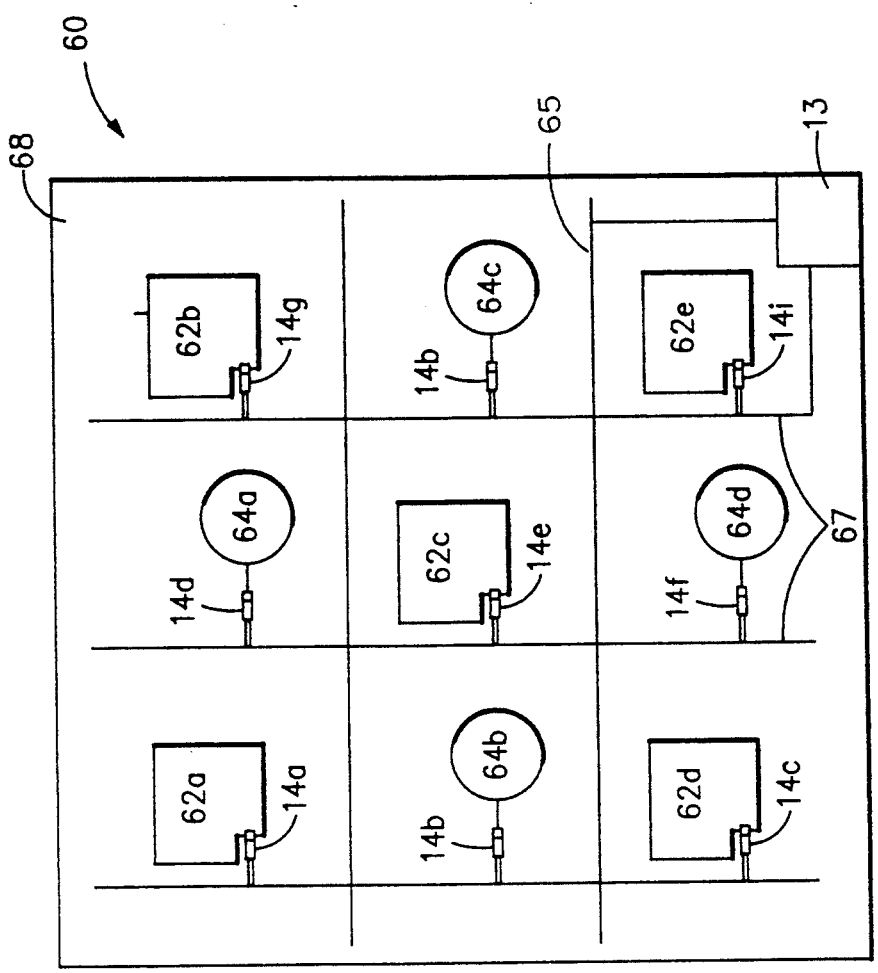
FIGS. 5-7 are partially schematic top plan views of an integrated source-detector matrix of photonic elements in alternate embodiments of the invention.

Turning now to FIG. 5, there is illustrated a first alternate embodiment of the invention, wherein an exemplary 3×3 integrated array comprises photodiodes 62a–62e that are configured as light sensors, and the light emitting elements are microlasers 64a–64d. The photodiodes 62a–62e and lasers 64a–64d are deposited on substrate 68 by methods known to the art, and are electrically isolated from one another by isolation devices 14a–14i. Opaque insulating material may be disposed between the photonic elements to prevent optical cross-communication therebetween. The lasers and photodiodes are selectively addressed by address bus 18. The signals are conveyed by signal lines 19, 20. If desired, greater versatility can be achieved by providing each photonic element with a dedicated address line, at a cost in density of component distribution on the substrate or chip. Ancillary electronics 13 may optionally be provided as discussed above with reference to FIG. 1. The proportion and distribution of the diodes and lasers may be varied in accordance with the needs of the application, the intensity of light emitted by the lasers 64, and the detection capabilities of the light diodes 62. This first alternate embodiment can be advantageously employed where intense, coherent light is required, as in optical interfaces and communicators. It will be appreciated that particular lasers 64 may emit light of differing wavelengths, and that the response of light sensors 62 may be individually matched to lasers 64 within array 60. In this way a plurality of functional subunits within the matrix can be established, each producing a signal in response to a different optical characteristic or maintaining an individual optical communication channel. Practical uses for such a matrix will be discussed below.

Figure 6:
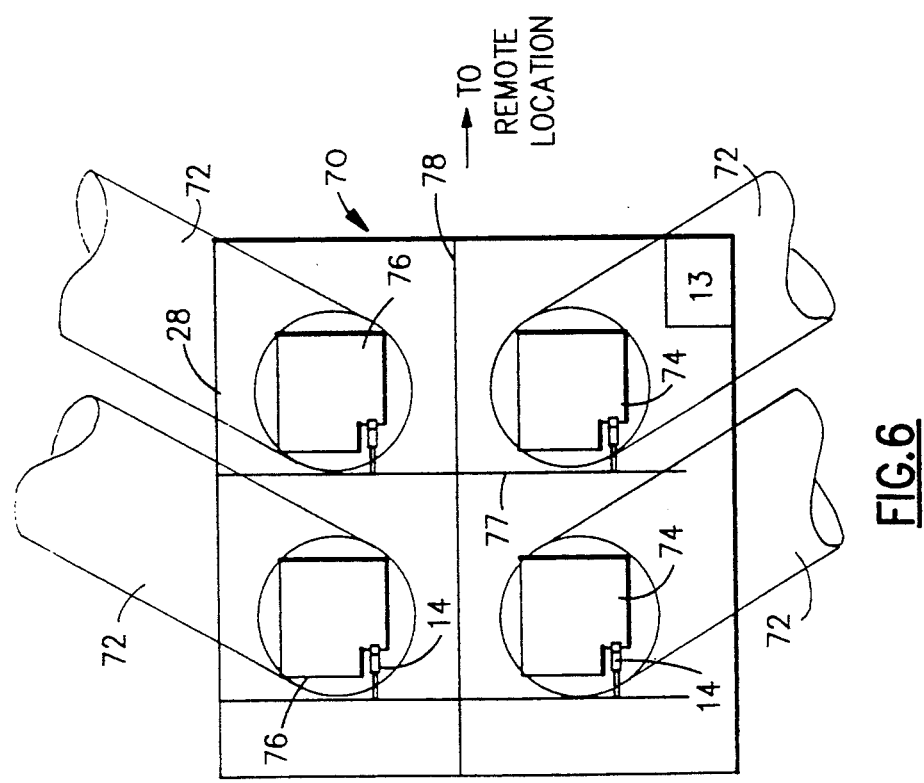

A second alternate embodiment of the invention is depicted in FIG. 6 wherein there is illustrated an integrated source-detector array, shown generally at 70 (aspects of which are also shown in FIGS. 2 and 3). Photonic elements comprising light detectors 74 and light sources 76 are shown in an exemplary 2×2 matrix. Light detectors 74 can be p-n diodes, p-i-n diodes, or phototransistors or the like. Light sources 76 are LEDs or lasers. The photonic elements 74, 76 are fabricated on a substrate 28 as explained above with reference to FIGS. 1 and 5, and can be provided in desired combinations. Each photonic element has its own data line 170 to external circuitry (not shown). As discussed above with reference to FIGS. 1 and 5, opaque material may be disposed between the photonic elements to prevent optical cross-communication. A proximal end face of an optical fiber waveguide 72 is disposed in face-to-face proximity with each of the photonic elements 74, 76. Waveguides 72, which may be fiberoptic lines, efficiently transmit light that is emitted from light emitting elements 76 to remote locations and return light from remote locations to light sensor elements 74. Ancillary electronics 13 may optionally be provided as discussed above.

Figure 8:
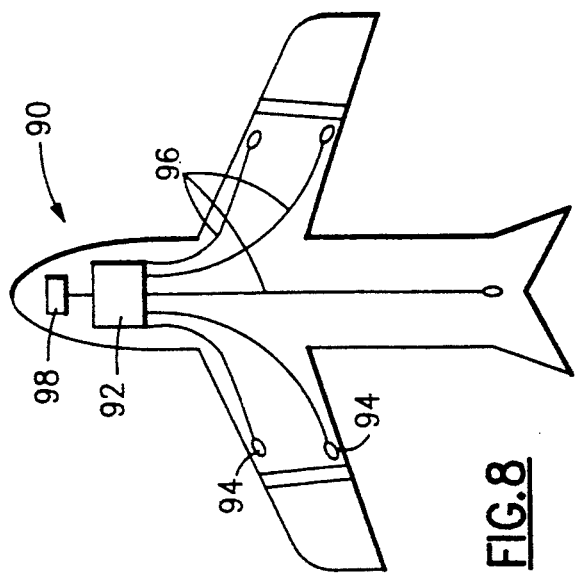
FIG. 8 is a diagrammatic view of an aircraft that incorporates an integrated source-detector matrix in accordance with the invention.

Turning now to FIG. 8, there is shown an exemplary application of the embodiment depicted in FIG. 6, wherein an integrated semiconductor array 92 is disposed in an aircraft 90. Fiberoptic waveguides 96 are coupled at their proximal ends to photonic elements on array 92 as discussed above and are directed through the aircraft to interface at their distal ends with sensor devices 94 that monitor operating conditions in the aircraft such as stress, temperature, and vibration. Optical signals emanate from the sensors and are conducted through the waveguides 96 and are received by the light sensing elements of array 92. Signals generated by the light sensing elements can be amplified by conventional electronics such as ancillary electronics 13 in FIG. 6 and coupled to display indicators or a computer that has been programmed to monitor the sensor outputs. Light emitting elements within array 92 can be optically coupled to the remote sensors 94 by waveguides 96 and can provide control signals and/or energy thereto. It will be appreciated by those skilled in the art that while the operation of array 92 has been explained with regard to an aircraft, array 92 could be incorporated in other apparatus including other transport, or in process control devices that are employed in manufacturing, chemical reactions, petroleum refining and the like. Array 92 could also be coupled with a second similar integrated array, wherein it would function as an optical communicator or repeater. This would be advantageous in applications involving very long distances where signal losses become significant. It will also be appreciated that such systems may be further optimized by the use of other optical elements such as lenses and apertures appropriately designed.

Figure 7:
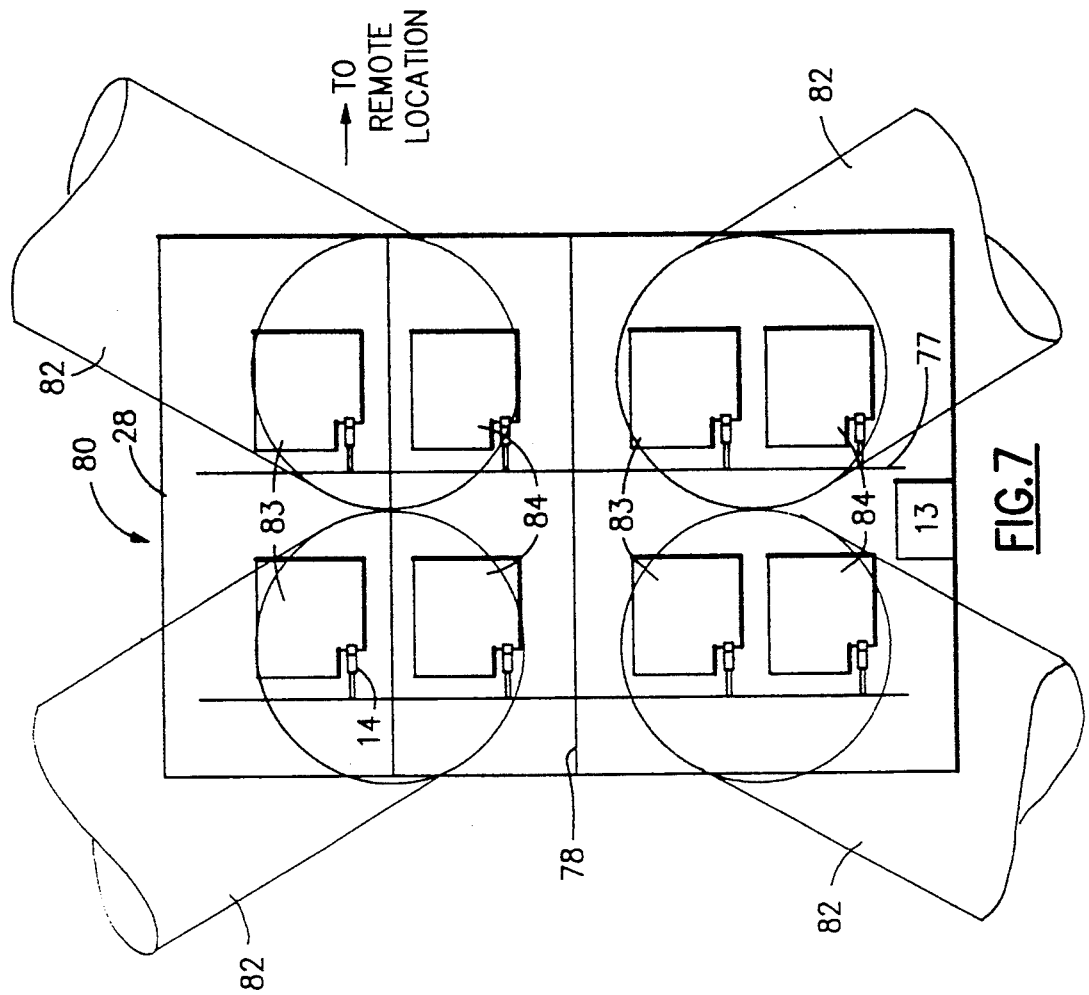

In FIG. 7 there is shown a variant of the embodiment described with respect to FIG. 6. In this embodiment, shown generally at 80, an exemplary matrix of light source elements 84 and light detecting elements 83 are disposed on substrate 28 in pairs. The proximal plane of a fiber optic waveguide 82 is disposed in face-to-face proximity with each pair of photonic elements 83, 84, while the distal plane of waveguide 82 is coupled to a remote location. Light is thereby intercommunicated between the pair of photonic elements 83, 84 and the remote location. Construction of array 80 in other respects is essentially identical to the embodiment of FIG. 6. It will also be appreciated that such systems may be further optimized by the use of other optical elements such as lenses and apertures appropriately designed.

Figure 9:
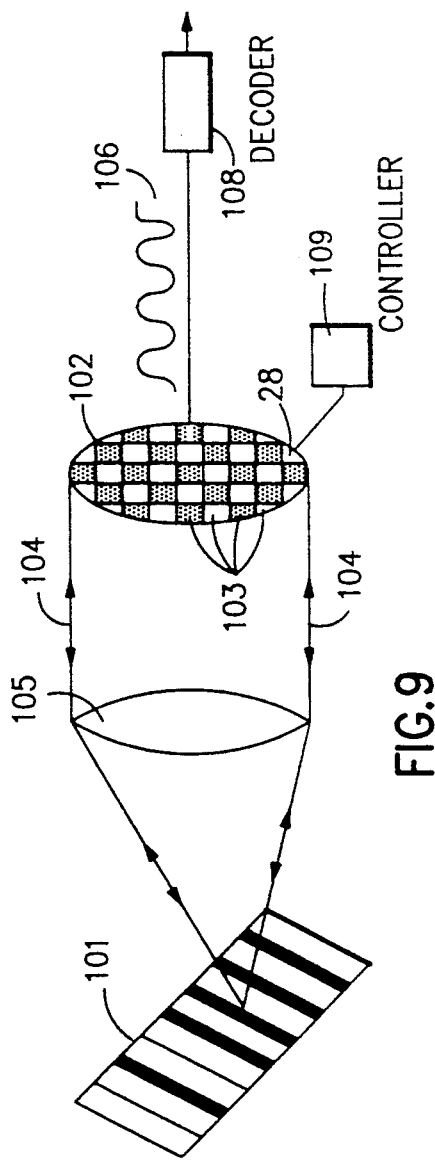
FIG. 9 is a schematic view of an integrated source-detector matrix in accordance with the invention that is incorporated in an optical indicia reader.
Figure 11:
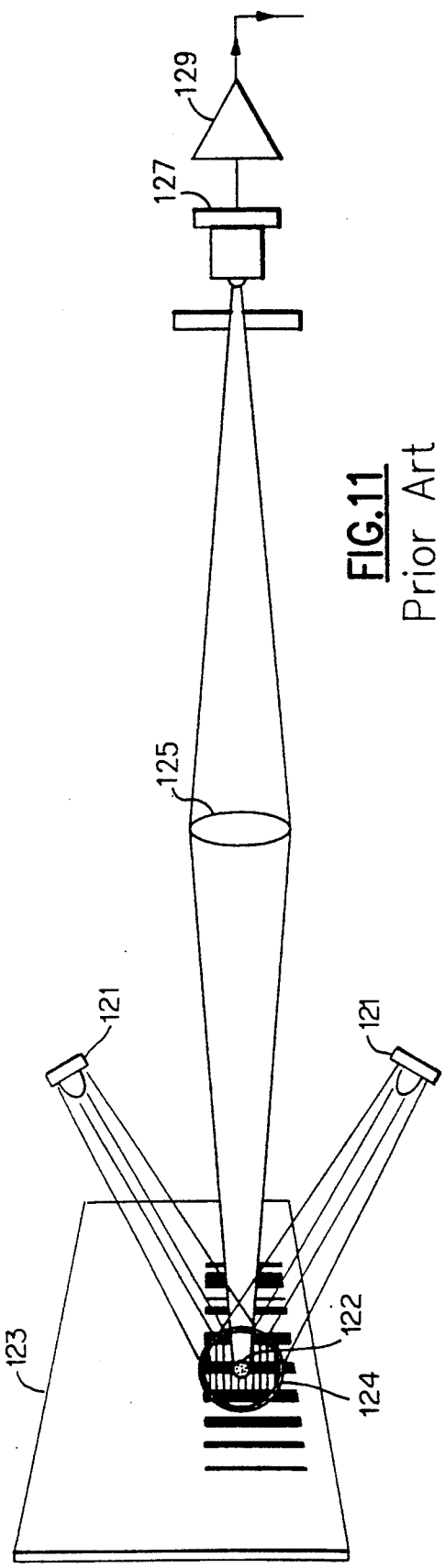
FIG. 11 is a schematic view of an optical reader in accordance with the prior art.
Figure 12A:
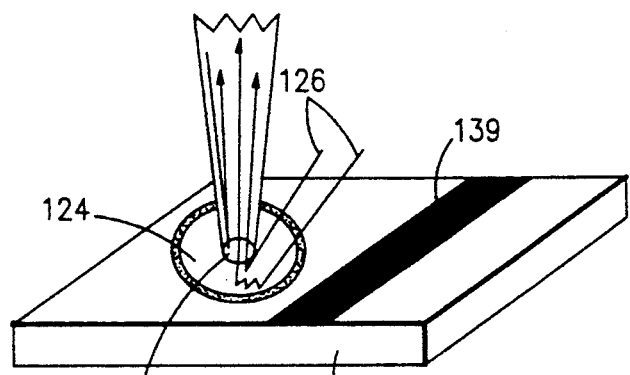
FIGS. 12-14 are diagrams that are useful in understanding the advantages of the present invention.
Figure 12B:
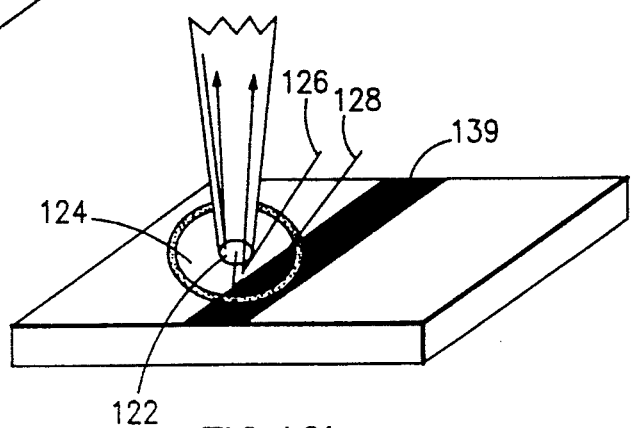
Figure 13:
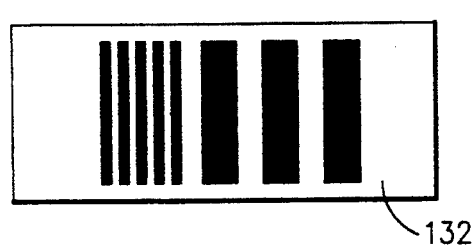
Figure 13:
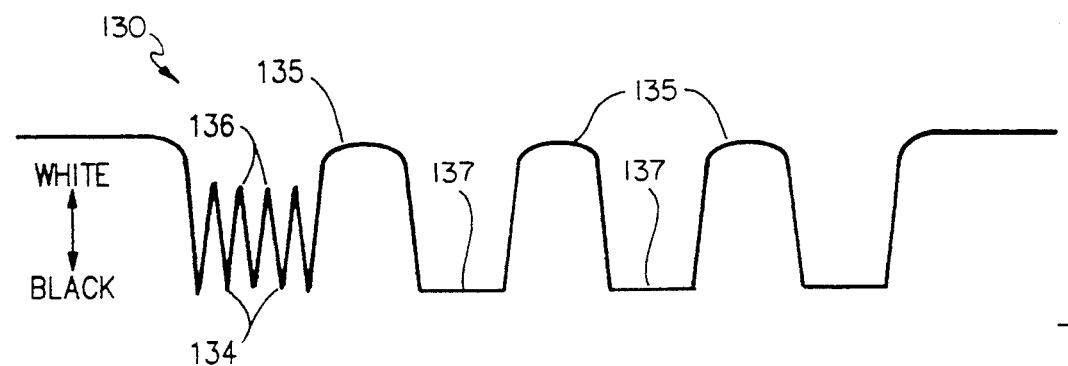
Figure 14:
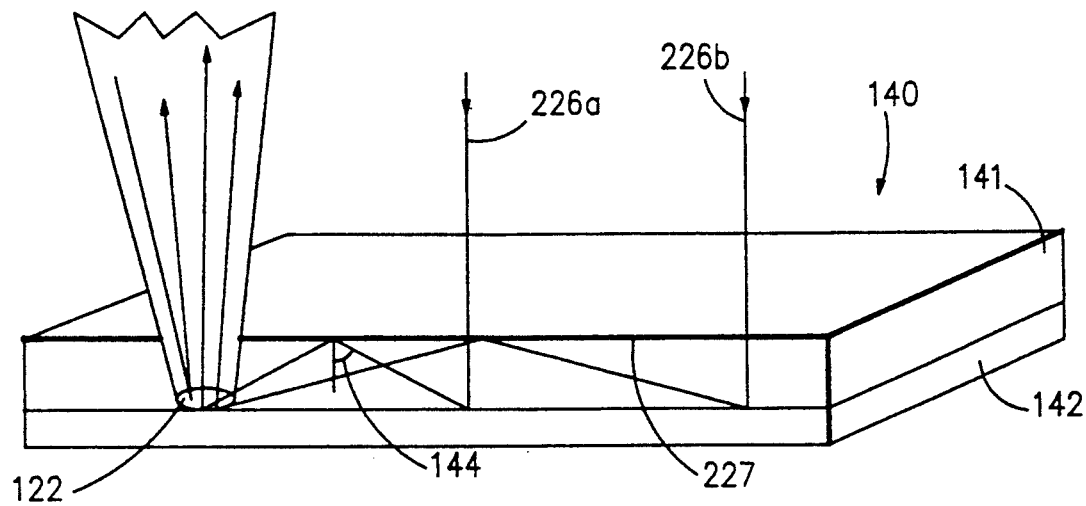

The integrated array according to the invention can improve the performance of optical imaging devices. Turning now to FIG. 9, there is schematically shown an image detector 100 that incorporates an integrated source-detector array 102 according to the present invention. The embodiments of the matrix discussed with respect to FIG. 1 or FIG. 5 are suitable. Areas 103 on substrate 28 are populated by light emitting and light detecting photonic elements, and comprise functional subunits within the matrix. Light beams, representatively denoted by reference numerals 104, 104, are directed between array 102 and target indicia 101 by optics 105. Optics 105 can be a mirror, a lens system, or could be omitted entirely in appropriate applications. While the target 101 is shown as a bar code, it is understood that the device could be designed to read other indicia such as OCR characters, ordinary text, and graphic images. Optics 105 can be designed so that particular regions 103 spatially correspond in their fields of view and illumination to limited regions on the target 101 with spatial dimensions less than the diffusion length of the indicia substrate. By choosing suitable optics, light emanating from a particular region 103 will not flood illuminate the target. Controller 109 is coupled to array 102 and can individually address regions 103 and photonic elements disposed therein. If desired, regions 103 can be permanently connected or spatially or temporally enabled by controller 109 so that the instrument reads selective regions on target 101, or sequentially reads a plurality of optical characteristics of the target. It will be recalled that the photonic elements can be tailored to differ from one another in spectral response. This facilitates the reading of more than one optical characteristic of target 101.

Figure 10:
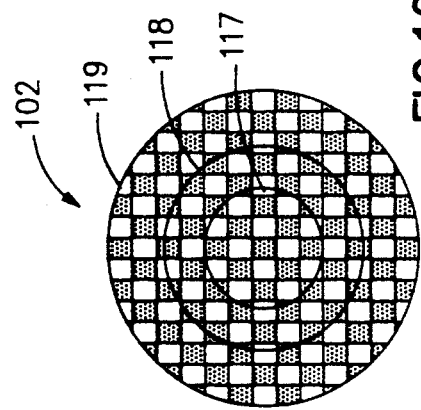
FIG. 10 is a schematic plan view of an integrated source-detector matrix in accordance with the invention that is helpful in understanding its operation in the apparatus depicted in FIG. 9.

In FIG. 10 there is illustrated matrix 102 which has been divided for purposes of explanation into concentric zones having boundaries 117, 118, 119. Controller 109, by addressing photonic elements in appropriate regions 103, can enable photonic elements that are contained within successively larger circular boundaries or in annular zones therebetween. In this way the image detector can operate with a variable scanning field of view.

Referring once again to FIGS. 4 and 9, when array 102 is constructed in accordance with the embodiment of FIG. 1, switch 34 (FIG. 4) can be operable by a controller such as controller 109. When required, controller 109 may cause a desired set of photonic diodes 36 that are included in regions 103 to alternate between a photoemitting and a photodetecting mode so that the instrument can perform optimally under changing conditions. As required in a given application, controller 109 may continually enable a set of diodes in a desired mode.

The signal produced by each of the light sensors is shown diagrammatically as waveform 106. This can be coupled to signal processing circuitry 108. Signal processing circuitry 108 could include a digitizer in the case of a bar code reader, that would convert the signal to bit serial form. In the case of optical information having periodicity, the signal processing circuitry 108 may include a processor adapted to signal processing algorithms as required for interpretation of the optical information that is detected by matrix 102. The output of the signal processing circuitry 108 may be submitted to any suitable display, storage medium, or to a computer or microprocessor.

The signal processing circuitry 108 may be colocated on substrate 28 with matrix 102. In applications where the signal processing is complex this may be impractical; nevertheless miniaturization may be achieved by placing the signal processing circuitry 108 and the array 102 in a common housing.

Figure 15:
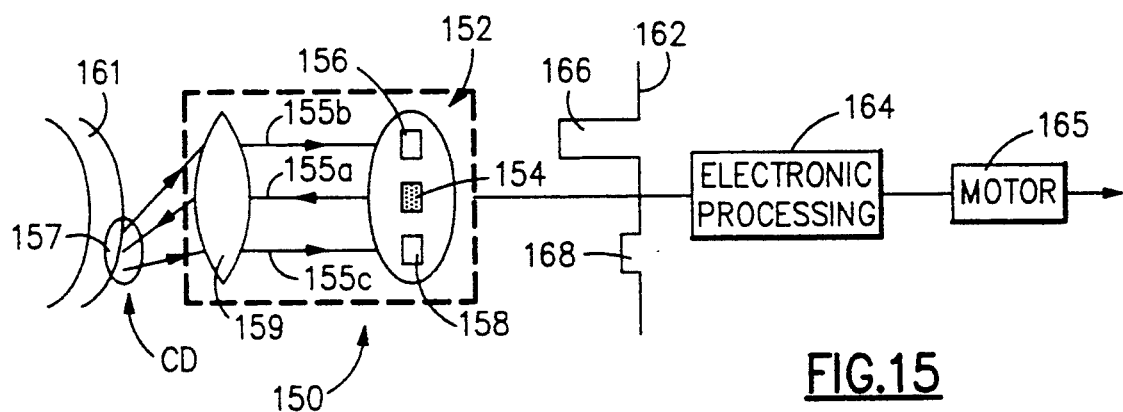
FIG. 15 is a schematic view of an integrated source-detector matrix in accordance with the invention that is incorporated in an optical head.

Turning now to FIG. 15, there is denoted generally by reference numeral 150 an optical head that incorporates an integrated source-detector array according to the invention. Array 152 is shown for purposes of explanation as a linear array having two light sensing elements 156, 158, and a single light emitter 154. However any appropriate m×n array or matrix can be employed. Light emanates as exemplary ray 155a, from light source 154, passes through optics 159, and is incident on a region 157 of target 161. Target 161 in this embodiment is an optical disk., but could be any object adjacent to optical head 150 wherein the displacement therebetween is sought to be determined. Light is reflected from region 157, and returned through optics 159 as rays 155b, 155c to be absorbed on light sensors 156, 158. Signals are generated by the light sensors, represented by waveform 162 wherein two signal levels are shown. The amplitudes 166, 168 of the signal levels are indicative of the displacement of the target 161 from light sensors 156, 158 respectively. The signals produced by light sensors 156, 158 are coupled to processing electronics 164 which control the operation of a motor 165 that adjusts the displacement between light sensors 156, 158 and target 161 to a desired level. In a given application the motor can operate so as to equalize amplitudes 166, 168, or it may adjust these amplitudes to a desired absolute level. Additionally the sum of signals 166-168 might be used to give additional information about the region 157.

Figure 16:
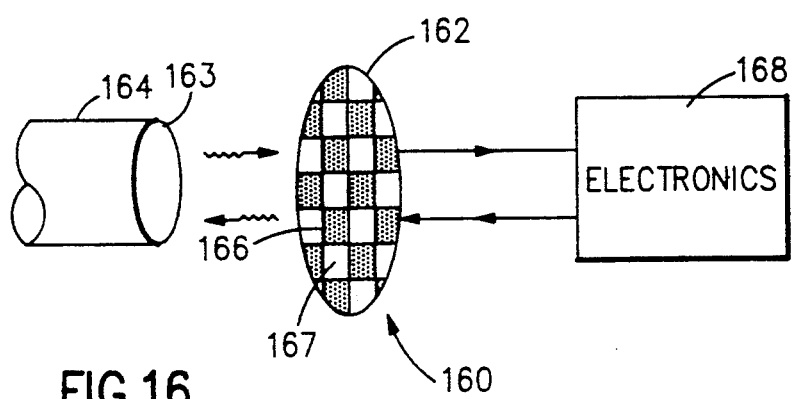
FIG. 16 is a schematic view of an integrated source-detector matrix in accordance with the invention that is incorporated in an optical interface.

In FIG. 16 there is shown at 160 an optical interface that includes an integrated source-detector array according to the invention. The array is coupled to a fiberoptic element 164 that may be an optical fiber or bundle of fibers. Light from photoemitting elements of array 162 penetrates end plane 163 and is conducted through fiber 164 to a remote location. As is well known in the fiberoptic art, multiple communication channels can coexist in an optical fiber. A communication channel could correspond, to particular combinations of light sources and light sensors in array 162, such as light source 166 and light sensor 167. These photonic elements may emit or be responsive to light of differing wavelengths. Light traveling through fiber 164 in the direction of array 162 may be incident on light sensor 166 and convey information from a remote location. As explained above, electrical signals that are interchanged between matrix 162 and processing electronics 168 govern the operation of the interface. While one optical fiber 164 is shown in FIG. 16 for purposes of explanation, it will be understood by those skilled in the art that a plurality of fibers can be employed.

While this invention has been explained with reference to the structure disclosed herein, it is not confined to the details set forth and this application is intended to cover any modifications and changes as may come within the scope of the following claims.

What is claimed is:

1. An optical information detecting apparatus comprising:
    an integrated, solid state structure further comprising a plurality of photonic diodes configured as a plurality of light sensors and a plurality of light emitting elements disposed on a substrate and are electrically isolated from one another, said light sensors being optically isolated from said light emitting elements, said diodes having a vertical structure, comprising a plurality of identically fabricated layers, corresponding layers of said diodes being mutually coplanar;
    circuit means connected to said light sensors for enabling said diodes to detect light, whereby a signal is generated in response to said detected light; and
    means for directing light that emanates from said light emitting elements to a target and for returning light that contains optical information to said light sensors, said means for directing light being external to said solid state structure;
    whereby said signal is indicative of an optical characteristic of said target.

2. The apparatus of claim 1, further comprising control means for selectively enabling and disabling said diodes.

3. The apparatus of claim 1 wherein said photonic diodes have identical length and width dimensions.

4. The apparatus of claim 1, further comprising means for processing said signal.

5. The apparatus of claim 1, wherein said diodes are disposed between said substrate and said light directing means.

6. An optical information detecting apparatus comprising
  an integrated, solid state structure further comprising
    a first plurality of substantially coplanar photonic diodes disposed on a substrate and are optically and electrically isolated from one another;
    circuit means for enabling said diodes to detect light, whereby a signal is generated in response to said detected light;
    a second plurality of light emitting elements comprising identically fabricated photonic diodes that are substantially coplanar with said first plurality of photonic diodes said first and second plurality of photonic diodes being identically fabricated;
    means for switchably operating at least one of said identically fabricated photonic diodes in a photoemissive mode and a photodetecting mode; and
    means for directing light that emanates from said light emitting elements to a target and for returning light that contains optical information to said diodes, said means for directing light being external to said solid state structure;
    whereby said signal is indicative of an optical characteristic of said target.

7. A bar code reading apparatus having an integrated, solid state structure that comprises
  a plurality of photodiodes disposed on a substrate and are electrically isolated from one another, said diodes having a vertical structure, comprising a plurality of layers, corresponding layers of said diodes being mutually coplanar, said diodes further having identical length and width dimensions;
  circuit means for enabling said photodiodes to detect light, whereby a signal is generated in response to said detected light,
  a plurality of light emitting diodes having a vertical structure, comprising a plurality of layers that are substantially coplanar with corresponding layers of said photodiodes, said photodiodes and said light emitting diodes being identically fabricated and
  means for directing light that emanates from said light emitting diodes onto indicia being read and for returning light reflected from said indicia to said photodiodes, said means for directing light being external to said solid state structure.

8. The apparatus of claim 7, further comprising control means for selectively enabling and disabling said light emitting diodes and said photodiodes, whereby a variable area on a target can be scanned.

9. The apparatus of claim 7 wherein said light emitting diodes and said photodiodes have identical length and width dimensions.

10. The apparatus of claim 7, wherein said light emitting elements and said photodiodes comprise identically fabricated photonic diodes.

11. The apparatus of claim 7, further comprising means for processing said signal.

12. The apparatus of claim 11, wherein said means for processing and said integrated solid state structure are integral within a common housing.

13. The apparatus of claim 11, wherein said means for processing and said solid state structure are integrated on a common substrate.

14. The apparatus of claim 7, wherein said photodiodes and said light emitting diodes are operatively associated as members of functional subunits, and light that emanates from light emitting members of a subunit and passes through said light directing means is reflected from said indicia and communicated to light sensing members of said subunit.

15. The apparatus of claim 7, wherein at least two light emitting diodes are connected in non-isolated electrical connection to a common data line, whereby a plurality of light emitting diodes can be simultaneously controlled in a matrix without addressing logic.

16. The apparatus in accordance with claim 7, wherein said photodiodes are optically isolated from said light emitting diodes.

17. The apparatus in accordance with claim 7, wherein said photodiodes are identically fabricated.

18. A method of reading indicia on a substrate, comprising the steps of:
  collocating a plurality of identically fabricated light emitting and light sensing elements in a region, said elements having a vertical structure, comprising a plurality of layers, corresponding layers of said elements being mutually coplanar, said elements further having identical length and width dimensions;
  forming optical images of said elements on an indicia;
  causing a light emitting element to emit light that is incident on said indicia and is reflected therefrom into said region;
  detecting reflected light with at least one of said light sensing elements and producing a signal in response thereto that is indicative of an optical characteristic of said indicia.

19. The method of claim 18, wherein said substrate has a diffusion path length, and optical images of said elements are no larger than said diffusion path length.

20. The method of claim 19, wherein said diffusion path length is less than about 0.05 mm.

21. The method of claim 18, further comprising the steps of connecting at least two identical elements selected from said light sensing elements and said light emitting elements in non-isolated electrical connection with a common data.

22. The method according to claim 18, wherein said light emitting elements are optically isolated from said light sensing elements.

23. An optical information detecting apparatus comprising:
  an integrated, solid state structure further comprising
    a plurality of photodiodes configured as light sensors disposed on a substrate, said photodiodes each having a non-isolated electrical connection to a common control line, whereby a matrix of said photodiodes can be controlled without addressing logic; and
    a plurality of light emitting elements that are substantially coplanar with said photodiodes, said photodiodes and said light emitting elements being identically fabricated; and
  means for directing light that emanates from said light emitting elements to a target and for returning light that contains optical information to said photodiodes, said means for directing light being external to said solid state structure;
  whereby said signal is indicative of an optical characteristic of said target.

24. The apparatus in accordance with claim 23, wherein said photodiodes are optically isolated from said light emitting elements.

25. An optical information detecting apparatus comprising:

an integrated, solid state structure further comprising:
- a plurality of photonic diodes configured as a plurality of light sensors that generate a signal responsive to light incident thereon, and a plurality of light emitting diodes disposed on a substrate, said diodes having a vertical structure comprising a plurality of identically fabricated layers, corresponding layers of said diodes being mutually coplanar; and
- means for directing light that emanates from said light emitting diodes to a target and for returning light that contains optical information to said light sensors, said means for directing light being external to said solid state structure;
- whereby said signal is indicative of an optical characteristic of said target.

26. The apparatus of claim 25 wherein said photonic diodes have identical length and width dimensions.

27. The apparatus in accordance with claim 25, wherein said light sensors are optically isolated from said light emitting diodes.

28. A method of reading indicia on a substrate, comprising the steps of:
- collocating a plurality of light emitting and light sensing elements in a region, said light emitting and light sensing elements being identically fabricated;
- connecting at least two identical elements selected from said light sensing elements and said light emitting elements in non-isolated electrical connection with a common data line;
- forming optical images of said elements on an indicia;
- causing a light emitting element to emit light that is incident on said indicia and is reflected therefrom into said region;
- detecting reflected light with at least one of said input sensing elements and producing a signal in response thereto that is indicative of an optical characteristic of said indicia.

29. The method according to claim 28, wherein said light emitting elements are optically isolated from said light sensing elements.

* * * * *